United States Patent
Uchida

(10) Patent No.: US 8,900,902 B2
(45) Date of Patent: Dec. 2, 2014

(54) PROCESS FOR PRODUCING SURFACE-EMITTING LASER AND PROCESS FOR PRODUCING SURFACE-EMITTING LASER ARRAY

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 466 days.

(21) Appl. No.: 12/983,536

(22) Filed: Jan. 3, 2011

(65) Prior Publication Data

US 2011/0165712 A1 Jul. 7, 2011

(30) Foreign Application Priority Data

Jan. 6, 2010 (JP) .................. 2010-000857

(51) Int. Cl.
*H01L 21/00* (2006.01)
*H01S 5/20* (2006.01)
*H01S 5/183* (2006.01)

(52) U.S. Cl.
CPC ........... *H01S 5/18344* (2013.01); *H01S 5/2081* (2013.01)
USPC .................. 438/39; 438/22; 438/23; 438/34; 257/E21.002; 257/E21.214; 257/E33.067; 257/E33.072

(58) Field of Classification Search
CPC .... B82Y 20/00; H01L 33/0079; H01L 27/15; H01L 21/8252; H01S 5/227
USPC ............ 438/34, 22, 23, 28, 39; 257/E21.002, 257/214, E33.067, 72
See application file for complete search history.

(56) References Cited

U.S. PATENT DOCUMENTS

| | | | | |
|---|---|---|---|---|
| 6,750,071 B2 * | 6/2004 | Chirovsky et al. | ............... | 438/22 |
| 7,033,853 B2 * | 4/2006 | Supper | ............... | 438/39 |
| 7,145,183 B2 * | 12/2006 | Supper | ............... | 257/98 |
| 7,842,530 B2 * | 11/2010 | Uchida | ............... | 438/39 |
| 2004/0058467 A1 * | 3/2004 | Chirovsky et al. | ............... | 438/32 |
| 2004/0151221 A1 * | 8/2004 | Yamamoto et al. | ............... | 372/32 |
| 2004/0180460 A1 * | 9/2004 | Chirovsky et al. | ............... | 438/39 |
| 2005/0208688 A1 * | 9/2005 | Otoma et al. | ............... | 438/22 |
| 2005/0214961 A1 * | 9/2005 | Supper | ............... | 438/21 |
| 2007/0014324 A1 * | 1/2007 | Maeda et al. | ............... | 372/46.01 |
| 2008/0240190 A1 * | 10/2008 | Kuramoto et al. | ............... | 372/44.01 |
| 2009/0310637 A1 * | 12/2009 | Kageyama et al. | ............... | 372/43.01 |
| 2010/0040104 A1 * | 2/2010 | Maeda et al. | ............... | 372/50.124 |

FOREIGN PATENT DOCUMENTS

JP 2006-210429 8/2006

* cited by examiner

*Primary Examiner* — Thao X Le
*Assistant Examiner* — Eric Jones
(74) *Attorney, Agent, or Firm* — Fitzpatrick, Cella, Harper and Scinto

(57) ABSTRACT

Provided is a producing of a surface-emitting laser capable of aligning a center axis of a surface relief structure with that of a current confinement structure with high precision to reduce a surface damage during the producing. The producing of the laser having the relief provided on a laminated semiconductor layer and a mesa structure, the process comprising the steps of: forming, on the layer, one of a first dielectric film and a first resist film having a first pattern for defining the mesa and a second pattern for defining the relief and then forming the other one of the films; forming a second resist film to cover the second pattern and expose the first pattern; and forming the mesa by removing the layer under the first pattern using the second resist film.

10 Claims, 13 Drawing Sheets

PROCESS FOR PRODUCING SURFACE-EMITTING LASER AND PROCESS FOR PRODUCING SURFACE-EMITTING LASER ARRAY

BACKGROUND OF THE INVENTION

1. Field of the Invention

The present invention relates to a process for producing a surface-emitting laser, and to a process for producing a surface-emitting laser array.

2. Description of the Related Art

Vertical Cavity Surface Emitting Laser (hereinafter, referred to as VCSEL) has been known as one of surface-emitting lasers. In the surface-emitting laser, an active region is sandwiched on both sides thereof by two reflectors to form a resonator in a direction perpendicular to a substrate surface, and light is emitted in the direction perpendicular to the substrate surface. It is important for the surface-emitting laser to control transverse mode oscillation. When the surface-emitting laser is to be applied to communications, a transverse mode output is required to be a single-mode output. Therefore, in the surface-emitting laser, a current confinement structure is provided in an inner portion thereof by selective oxidation to limit a light emitting region of an active layer, thereby realizing a single transverse mode. However, when the single transverse mode is to be realized by only the current confinement structure, it is necessary to reduce a confinement diameter. When the confinement diameter reduces, the light emitting region becomes smaller, and hence it is difficult to obtain larger laser power.

Therefore, various transverse mode control structures except the current confinement structure have been studied. As one of the control structures, a step structure including a dielectric film is formed on a light emission region of a surface-emitting laser described in Japanese Patent Application Laid-Open No. 2006-210429. When the step structure is formed, a reflectance of a peripheral region surrounding a central region is lower than a reflectance of the central region, and hence high-order transverse mode oscillation may be suppressed.

In this specification, not only the step structure for reflectance control but also a step structure and the like for providing a phase difference between light beams passing therethrough by the step structure to control a wavefront of a near-field pattern (NFP) are referred to as a surface relief structure.

By the way, when the surface relief structure is to be formed, it is important to laterally align the surface relief structure and the current confinement structure with each other. That is, in order to efficiently obtain single mode oscillation in a fundamental transverse mode, the surface relief structure for providing a loss difference and the current confinement structure for determining a light mode are desired to be aligned with each other with high precision. For example, when a center axis of the surface relief structure and a center axis of the current confinement structure are shifted from each other, an unintended loss is introduced into an oscillation mode (for example, fundamental transverse mode). However, even when a manufacturing method disclosed in Japanese Patent Application Laid-Open No. 2006-210429 is employed, it is difficult to align the center axis of the current confinement structure and the center axis of the dielectric relief structure with each other. To be specific, in Japanese Patent Application Laid-Open No. 2006-210429, a mesa structure is formed, and then the formation of the dielectric film, photolithography, and etching are repeated to provide the relief structure as a laminate structure of the dielectric film on an upper surface of the mesa structure. Therefore, it is difficult to align a center axis of the mesa structure and the center axis of the dielectric relief structure with each other. As a result, it is difficult to align the center axis of the current confinement structure and the center axis of the dielectric relief structure with each other.

SUMMARY OF THE INVENTION

Therefore, the present invention has been made in view of the problem as described above. An object of the present invention is to provide a process for producing a surface-emitting laser in which a center axis of a surface relief structure and a center axis of a current confinement structure may be aligned with each other with high precision. Another object of the present invention is to provide a process for producing a surface-emitting laser array using the process for producing a surface-emitting laser.

A process for producing a surface-emitting laser according to the present invention includes a surface relief structure provided on a laminated semiconductor layer and a mesa structure, comprising: forming step of forming a first dielectric film and a first resist film having a first pattern for defining the mesa structure and a second pattern for defining the surface relief structure on the laminated semiconductor layer; forming step of forming a second resist film to cover the second pattern and to expose the first pattern after the forming step of forming the first dielectric film and the first resist film; and forming step of forming the mesa structure by removing a portion of the laminated semiconductor layer under the first pattern using the second resist film as a mask after the forming step of forming the second resist film, wherein the first pattern and the second pattern are formed in the same step. A process for producing a surface-emitting laser array according to the present invention includes the process comprising arranging a plurality of surface-emitting lasers produced by the process according to claim 1.

According to the present invention, it is possible to achieve the process for producing a surface-emitting laser in which the center axis of the surface relief structure and the center axis of the current confinement structure may be aligned with each other with high precision. Further, it is possible to achieve the process for producing a surface-emitting laser array using the process for producing a surface-emitting laser.

Further features of the present invention will become apparent from the following description of exemplary embodiments with reference to the attached drawings.

DESCRIPTION OF THE EMBODIMENTS

Hereinafter, embodiments of the present invention are described.

First Embodiment

Figure 1A:
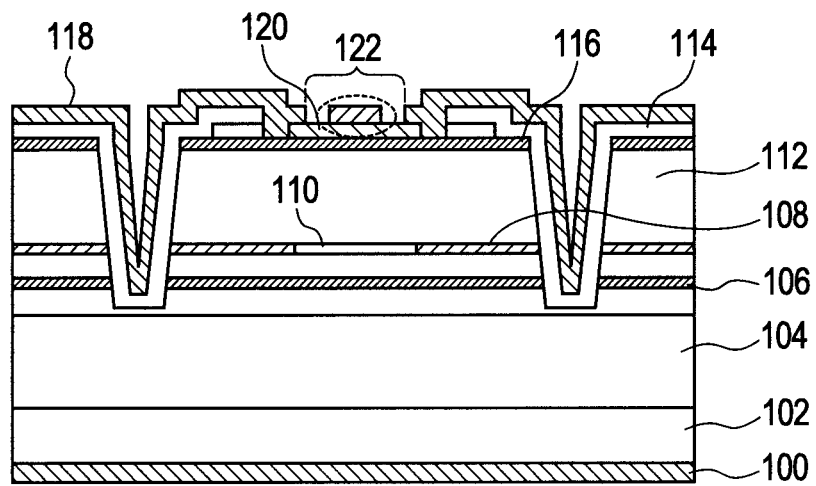
FIGS. 1A and 1B are schematic views illustrating a structure of a surface-emitting laser produced by a vertical cavity surface-emitting laser producing process according to a first embodiment of the present invention.
Figure 1B:
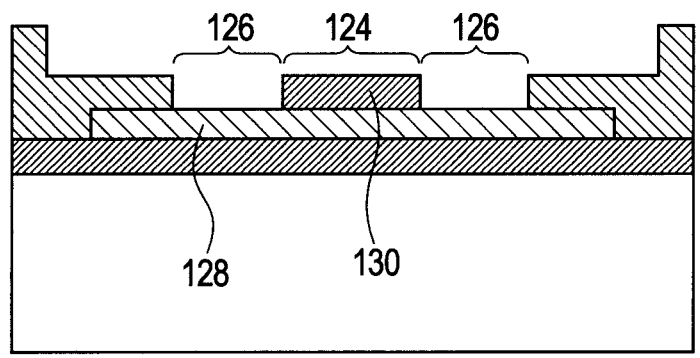

In a first embodiment, a process for producing a vertical cavity surface-emitting laser including a convex shape dielectric surface relief structure is described with reference to FIGS. 1A and 1B. FIG. 1A is a schematic cross sectional view illustrating a surface-emitting laser including a light emission region 122. FIG. 1B is an enlarged view illustrating the light emission region 122 and the surroundings thereof. In FIG. 1A, the surface-emitting laser includes an n-side electrode 100, a substrate 102, a lower distributed Bragg reflector (DBR) 104, an active layer 106, an oxidized region 108, and a non-oxidized region 110. The oxidized region 108 and the non-oxidized region 110 constitute a current confinement structure. The surface-emitting laser further includes an upper DBR 112, an insulating film 114, a contact layer 116, a p-side electrode (pad electrode) 118, and a surface relief structure 120. FIG. 1B illustrates a high-reflectance region 124, a low-reflectance region 126, a first dielectric film 128, and a second dielectric film 130.

The vertical cavity surface-emitting laser according to this embodiment is provided so that a center axis of the surface relief structure 120 made of a dielectric is aligned with a center axis of the non-oxidized region 110 of the current confinement structure. As described above, when the center axis of the surface relief structure 120 is aligned with the center axis of the non-oxidized region 110 of the current confinement structure, high-order mode emission may be suppressed with higher precision.

Figure 2A:
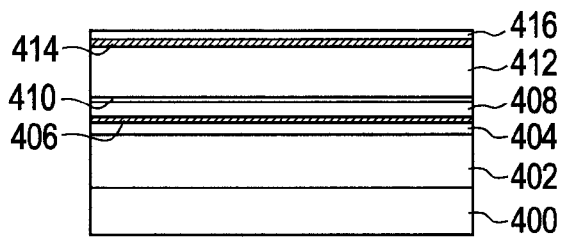
FIGS. 2A, 2B, 2C, 2D and 2E are views illustrating steps of the vertical cavity surface-emitting laser producing process according to the first embodiment of the present invention.

Next, the process for producing the surface-emitting laser according to this embodiment is described. In a step illustrated in FIG. 2A (first dielectric film forming step), a first dielectric film 416 is formed on a semiconductor layer as follows. First, a metal organic chemical vapor deposition (MOCVD) crystal growth technique is used. A lower n-type DBR mirror layer 402 of $Al_{0.9}Ga_{0.1}As/Al_{0.5}Ga_{0.5}As$ is grown on an n-type GaAs substrate 400 through a buffer layer (not shown). Further, an n-type spacer layer 404 of AlGaInP and a multi-quantum well (MQW) active layer 406 of GaInP/AlGaInP are grown on the lower n-type DBR mirror layer 402 in order. Then, a p-type spacer layer 408 of AlGaInP and a p-type selective oxide layer 410 of $Al_{0.98}Ga_{0.02}As$ are grown on the active layer 406. The p-type selective oxide layer 410 forms a current confinement structure through an oxidation processing performed later. Further, an upper p-type DBR mirror layer 412 of $Al_{0.9}Ga_{0.1}As/Al_{0.5}Ga_{0.5}As$, and a p-type GaAs contact layer 414 are grown on the selective oxide layer 410 in order. As described above, multiple semiconductor layers including the lower DBR mirror layer, the active layer, the selective oxide layer, and the upper DBR mirror layer are laminated on the substrate in order. Then, the first dielectric film 416 is formed on the laminated semiconductor layers. When a reflectance is to be controlled, a thickness of the first dielectric film 416 is, for example, $(2x-1)\lambda/4n_1$ (x is integer equal to or larger than 1, $\lambda$ is oscillation wavelength, and $n_1$ is refractive index of first dielectric film). When the step structure is used for control except reflectance control, for example, for wavefront control, the thickness of the first dielectric film 416 may be set as appropriate. Examples of a material of the first dielectric film 416 which may be used include silicon oxide, silicon nitride, and silicon oxynitride.

Figure 2B:
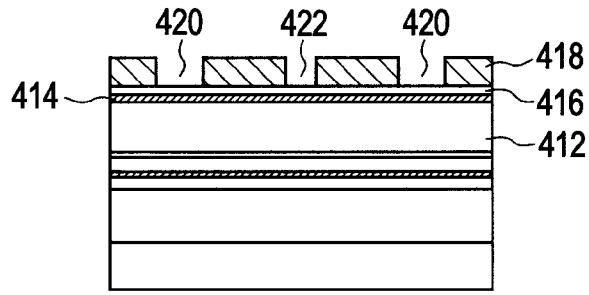
Figure 5A:
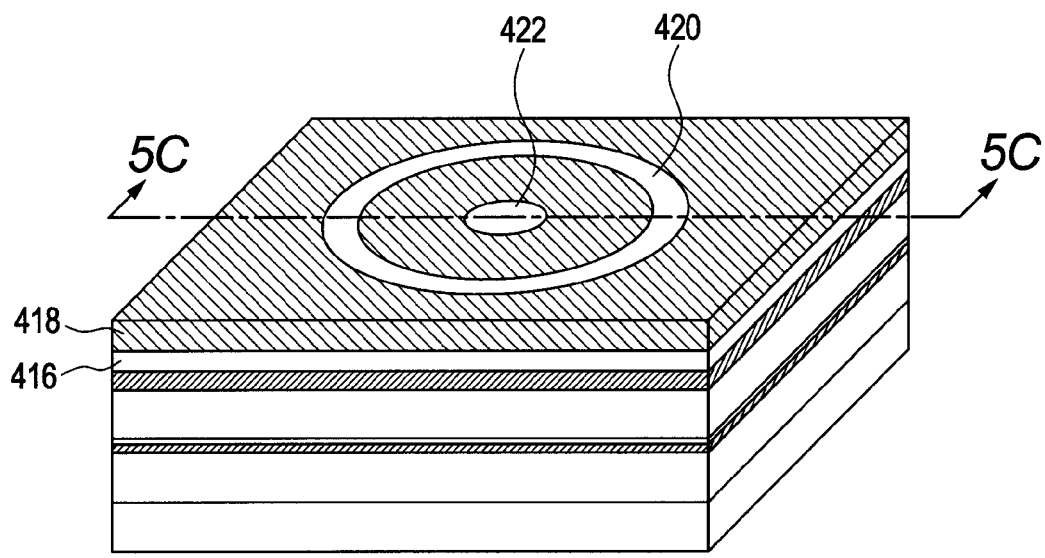
FIGS. 5A, 5B and 5C are schematic views illustrating a first resist film formed by the vertical cavity surface-emitting laser producing process according to the first embodiment of the present invention.
Figure 5B:
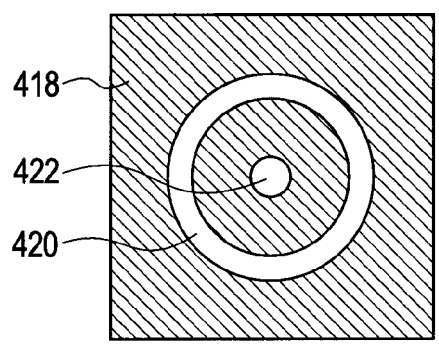
Figure 5C:
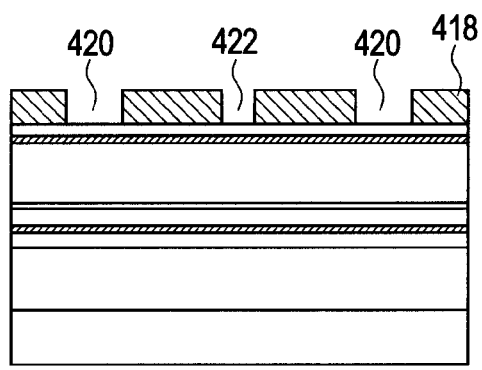

Subsequently, in a step illustrated in FIG. 2B (first resist film forming step), a resist film is formed on the first dielectric film 416 and patterned using a lithography technique to form a first resist film 418. FIGS. 5A, 5B and 5C are schematic views illustrating the first resist film 418 formed on the first dielectric film as described above. FIG. 5A is a perspective view illustrating the surface-emitting laser. FIG. 5B is a plan view illustrating the surface-emitting laser. FIG. 5C is a cross sectional view taken along the line 5C-5C illustrated in the perspective view. As illustrated in FIGS. 5A, 5B and 5C, the first resist film 418 is formed on the first dielectric film 416 so that a first pattern 420 and a second pattern 422, which have the same center axis but which are different in diameter from each other, include opening portions. The structure illustrated in FIGS. 5A, 5B and 5C includes a circular ring opening pattern having a large diameter and a circular opening pattern having a small diameter. However, the present invention is not limited to this structure. For example, the circular ring opening pattern having the large diameter may be a square ring pattern. In this step, the first pattern and the second pattern are formed on the first dielectric film 416 at the same process by the lithography technique, and hence a relative positional relationship between the first pattern and the second pattern is defined. The surface relief structure (step structure) is defined by the circular opening pattern having the small diameter (second pattern 422). A diameter of the mesa structure is determined by the circular ring opening pattern having the large diameter (first pattern 420). The mesa structure is oxidized from side surfaces thereof to form the current confinement structure. Therefore, when the diameter of the mesa structure is determined, the position of the non-oxidized region of the current confinement structure is also determined. As a result, the positional relationship between the current confinement structure and the surface relief structure (step structure) may be set with high precision.

Figure 2C:
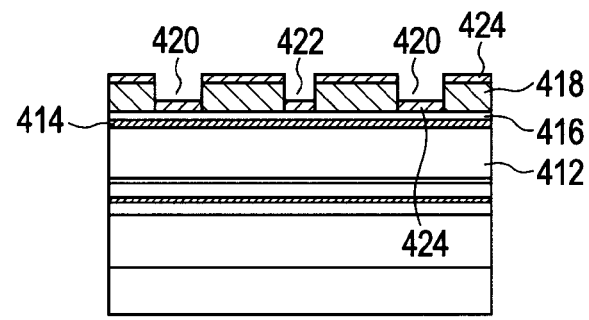

Next, in a step illustrated in FIG. 2C (second dielectric film forming step), a second dielectric film 424 is formed. A thickness of the second dielectric film 424 is, for example, $(2y-1)\lambda/4n_2$ (y is integer equal to or larger than 1, $\lambda$ is oscillation wavelength, and $n_2$ is refractive index of second dielectric film). The thickness of the second dielectric film 424 may be set as appropriate. Examples of a material of the second dielectric film 424 which may be used include silicon oxide, silicon nitride, and silicon oxynitride. The thickness of the first dielectric film 416 may be set to an odd multiple of a thickness corresponding to one-quarter of the oscillation wavelength. The thickness of the second dielectric film 424 may be set to an odd multiple of the thickness corresponding to the one-quarter of the oscillation wavelength. In this case, the second dielectric film 424 is formed so that the refractive index $n_2$ thereof is larger than the refractive index $n_1$ of the first dielectric film 416. For example, the first dielectric film and the second dielectric film may be a silicon oxide layer having a refractive index of 1.5 (optical thickness of $\lambda/4$) and a silicon nitride layer having a refractive index of 1.9 (optical thickness of $\lambda/4$), respectively.

Figure 2D:
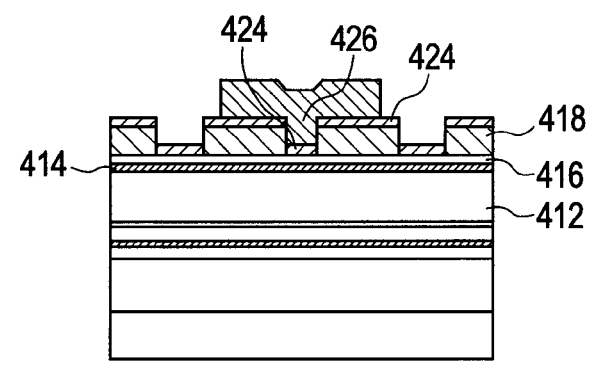
Figure 2E:
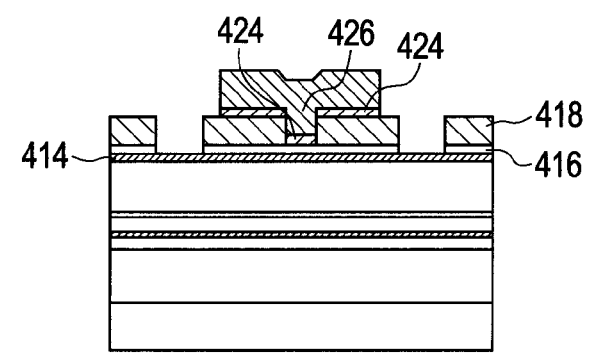
Figure 3A:
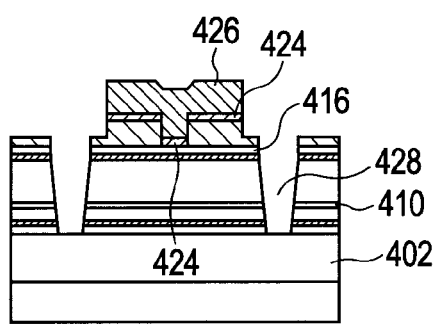
FIGS. 3A, 3B, 3C, 3D, 3E, 3F, 3G and 3H are views illustrating steps of the vertical cavity surface-emitting laser producing process according to the first embodiment of the present invention.
Figure 3E:
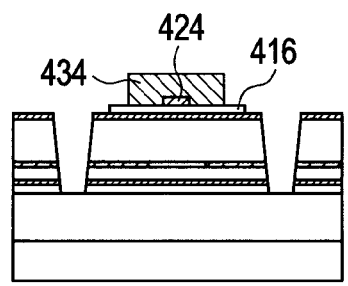

Subsequently, in a step illustrated in FIG. 2D (second resist film forming step), a second resist film 426 is formed using a lithography technique. In this case, the second resist film 426 is formed to completely cover the second pattern 422 in which a portion of the second dielectric film 424 is formed. Next, in a step illustrated in FIG. 2E (dielectric film removing step), the second resist film 426 is used as a mask and wet etching with buffered hydrofluoric acid is performed to remove the first dielectric film 416 in the first pattern and the second dielectric film 424. Next, in a step illustrated in FIG. 3A (mesa structure forming step), a trench 428 is formed by dry etching to expose the lower DBR mirror layer 402, to thereby manufacture a post of the mesa structure. When the selective oxide layer 410 for forming the current confinement structure is exposed and there is no trouble in a subsequent oxidization step (FIG. 3D), dry etching is not necessarily performed so that the lower DBR mirror layer 402 is exposed.

Figure 3B:
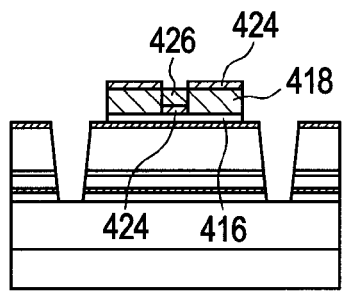
Figure 3F:
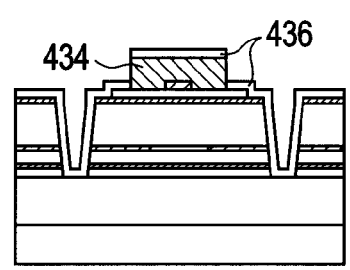
Figure 3C:
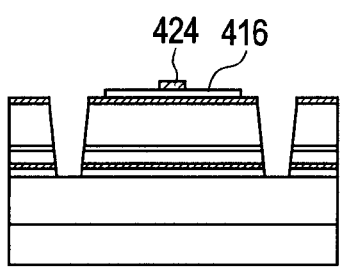
Figure 3G:
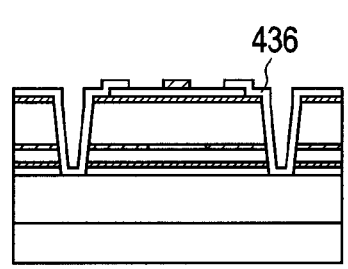
Figure 3D:
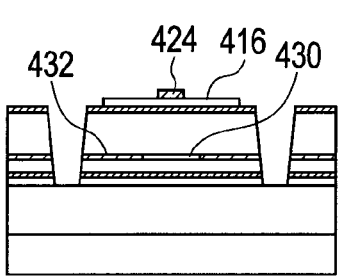

Next, in a step illustrated in FIG. 3B (second resist film removing step), the second resist film 426 is removed by an oxygen plasma ashing technique until the second dielectric film 424 formed on the first resist film 418 is completely exposed. Next, in a step illustrated in FIG. 3C (resist film removing step), the second dielectric film 424 formed on the first resist film 418 is removed by wet etching with buffered hydrofluoric acid. After that, a resist removal technique (including remover and oxygen plasma ashing) is employed to completely remove the first resist film 418 and the second resist film 426. Next, in a step illustrated in FIG. 3D (current confinement structure forming step), the p-type $Al_{0.98}Ga_{0.02}As$ layer (selective oxide layer) 410 is selectively oxidized in a water-vapor atmosphere at a substrate temperature of 450° C. to form the current confinement structure (oxidized region 432 and non-oxidized region 430). In this case, the surfaces of the laminated semiconductor layers other than the trench 428 are covered with one of the first dielectric film 416 and the second dielectric film 424, and hence the surfaces of the laminated semiconductor layers may be protected against the oxidization step. Therefore, an electrode (metal film 444) may be formed with an excellent contact resistance in a subsequent step (FIG. 4B).

Figure 3H:
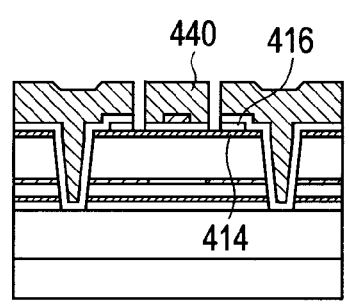

Next, in a step illustrated in FIG. 3E, a third resist film 434 is formed using a lithography technique to cover at least the second dielectric film 424. Next, in a step illustrated in FIG. 3F, a third dielectric film 436 is formed. Examples of a material of the third dielectric film 436 which may be used include silicon oxide, silicon nitride, and silicon oxynitride. Next, in a step illustrated in FIG. 3G, a liftoff technique is used to form an emission opening. When a thickness of the third dielectric film 436 is set to $(2z)\lambda/4n_3$ (z is integer equal to or larger than 1, $\lambda$ is oscillation wavelength, and $n_3$ is refractive index of third dielectric film) and a relationship of $n_3 \geq n_2 > n_1$ is satisfied, the step of forming the third resist film 434 as illustrated in FIG. 3E may be omitted. In this case, the structure of the completed device is illustrated in FIG. 4E. Next, in a step illustrated in FIG. 3H, a patterned fourth resist film 440 is formed using a lithography technique. After that, the first dielectric film 416 is removed by wet etching with buffered hydrofluoric acid to expose a part of the contact layer 414.

Figure 4A:
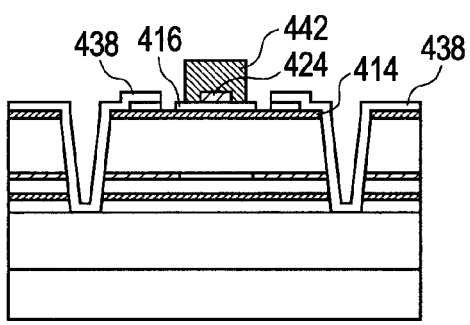
FIGS. 4A, 4B, 4C, 4D and 4E are views illustrating steps of the vertical cavity surface-emitting laser producing process according to the first embodiment of the present invention.
Figure 4B:
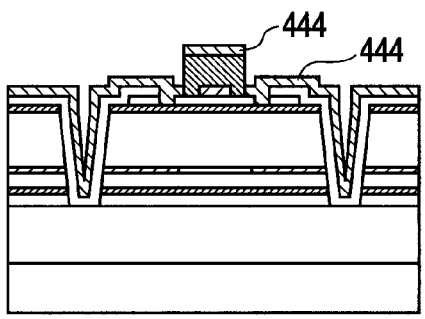
Figure 4C:
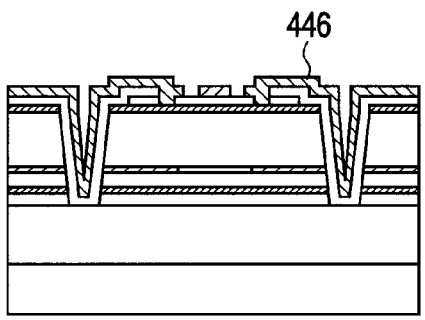
Figure 4D:
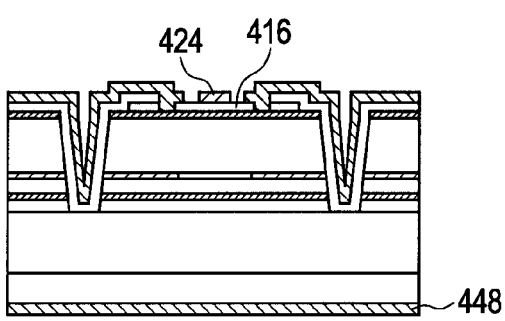
Figure 4E:
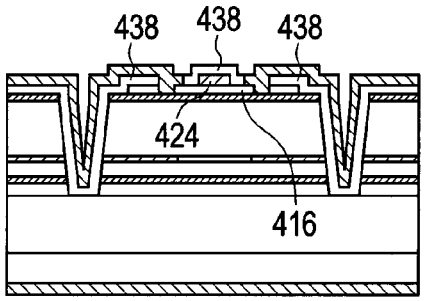

Next, in a step illustrated in FIG. 4A, a fifth resist film 442 is formed so as to cover the emission opening and to expose the part of the contact layer 414. Next, in a step illustrated in FIG. 4B, the metal film 444 made of Ti/Au is deposited on the surface by a metal deposition technique. Next, in a step illustrated in FIG. 4C, pad electrodes 446 are formed by a liftoff technique to expose the emission opening. Next, in a step illustrated in FIG. 4D, an n-side electrode (AuGe/Ni/Au) 448 is formed on a backside of the n-type GaAs substrate by a metal deposition technique.

According to the steps described above in this embodiment, the photolithography technique with high position precision is used to form the two opening patterns different from each other in shape, whose center axes are aligned with each other (circular ring opening pattern having large diameter and circular opening pattern having small diameter). The surface relief structure having controlled reflectance is defined by the small circular opening pattern and the diameter of the mesa structure is defined by the large circular ring opening pattern to define the non-oxidized region of the current confinement structure. Therefore, the center axis of the surface relief structure and the center axis of the non-oxidized region of the current confinement structure may be controlled with high position precision. When the large circular ring opening pattern is used to form the mesa structure by dry etching, the surface relief structure provided in the small circular opening pattern is protected by the dielectric film and the resist, and hence the surface relief structure is not exposed to the outside.

In this embodiment, the 680 nm band surface-emitting laser is described. However, the present invention is not limited thereto, and may be applied to, for example, an 850 nm band (GaAs/AlGaAs active layer system) surface-emitting laser. Techniques (apparatuses) used for growth, lithography, etching, ashing, and vapor deposition described in this embodiment are not limited to the described techniques (apparatuses). As long as the same effects are obtained, any technique (apparatus) may be employed. In this embodiment, the process for producing a surface-emitting laser of a single device is described. When multiple surface-emitting lasers, each of which is the surface-emitting laser of a single device, are arranged in array, the producing process described above may be applied.

Second Embodiment

Figure 6A:
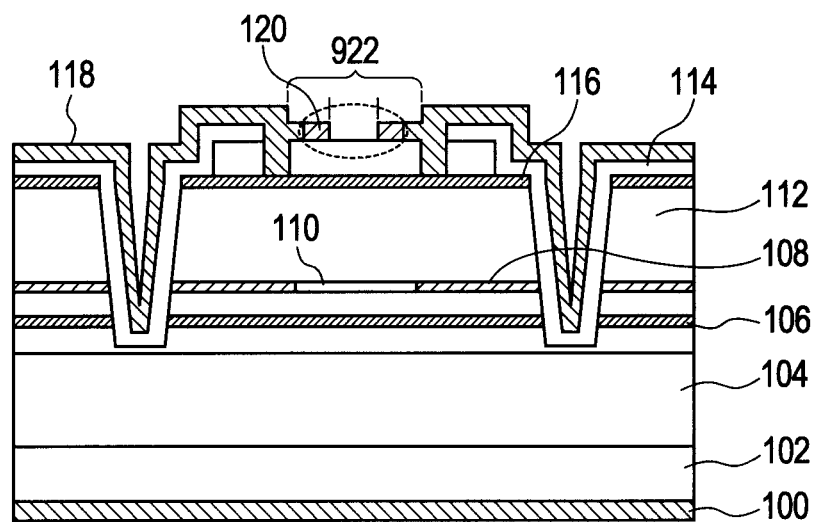
FIGS. 6A and 6B are schematic views illustrating a structure of a surface-emitting laser produced by a vertical cavity surface-emitting laser producing process according to a second embodiment of the present invention.
Figure 6B:
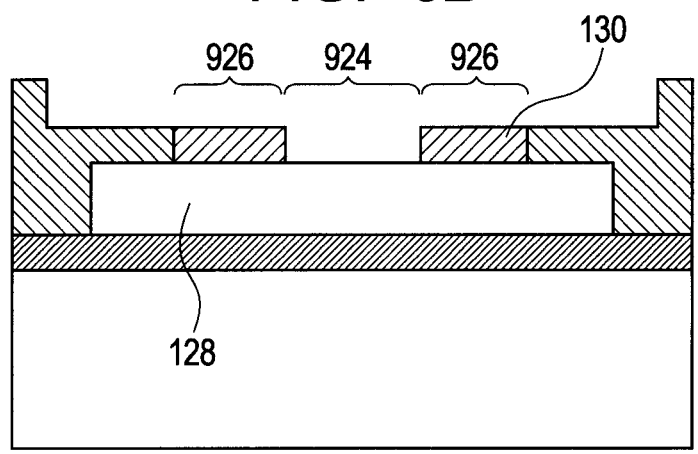

In a second embodiment, with reference to FIGS. 6A and 6B, a process for producing a vertical cavity surface-emitting laser having a concave shape dielectric surface relief structure is described. FIG. 6A is a schematic cross sectional view illustrating a surface-emitting laser including a light emission region 922. FIG. 6B is an enlarged view illustrating the light emission region 922 and the surroundings thereof. FIG. 6B illustrates a high-reflectance region 924, a low-reflectance region 926. In FIGS. 6A and 6B, the same constituent elements as in the first embodiment illustrated in FIGS. 1A and 1B are expressed by the same reference numerals, and hence the duplicated descriptions thereof are omitted. In the first embodiment, a high-reflectance region 124 is a convex shape. In contrast, in this embodiment, a surface relief structure in which the high-reflectance region 924 is a convex shape.

Next, the process for producing a surface-emitting laser according to this embodiment is described. A difference from the producing process according to the first embodiment is based on the second pattern of the first resist film. The thickness of the first dielectric film 416 is, for example, $2x\lambda/4n_1$ (x is integer equal to or larger than 1, $\lambda$ is oscillation wavelength, and $n_1$ is refractive index of first dielectric film). The thickness of the second dielectric film 424 is, for example, $(2y-1)\lambda/4n_2$ (y is integer equal to or larger than 1, $\lambda$ is oscillation wavelength, and $n_2$ is refractive index of second dielectric film). The thickness of each of the dielectric films may be set as appropriate. The thickness of the first dielectric film 416 may be set to an integral multiple (equal to or larger than one) of a thickness corresponding to a half of the oscillation wavelength. The thickness of the second dielectric film 424 may be set to an odd multiple of a thickness corresponding to one-quarter of the oscillation wavelength. In this case, the second dielectric film 424 is formed so that the refractive index $n_2$ thereof is larger than the refractive index $n_1$ of the first dielectric film 416. For example, the first dielectric film and the second dielectric film may be a silicon oxide layer having a refractive index of 1.5 (optical thickness of $\lambda/2$) and a silicon nitride layer having a refractive index of 1.9 (optical thickness of $\lambda/4$), respectively. The other steps are the same as those in the first embodiment.

Figure 7A:
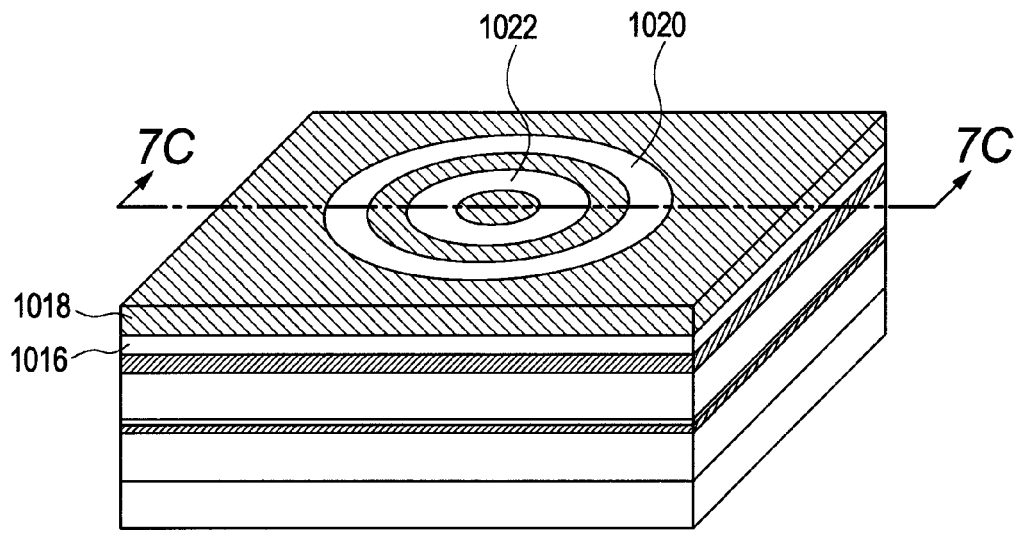
FIGS. 7A, 7B and 7C are schematic views illustrating a first resist film formed by the vertical cavity surface-emitting laser producing process according to the second embodiment of the present invention.
Figure 7B:
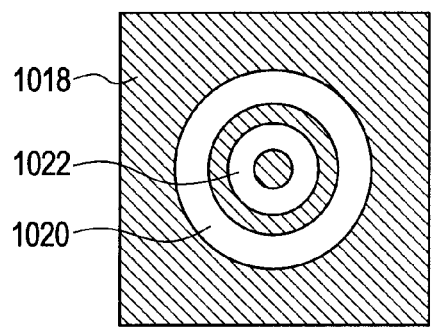
Figure 7C:
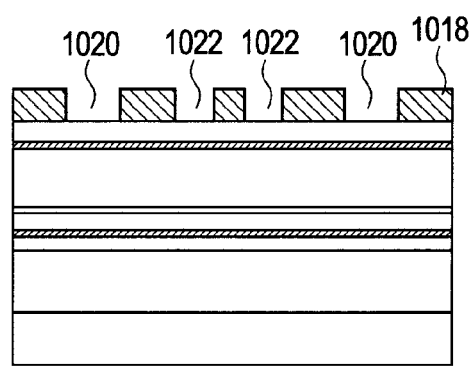

FIGS. 7A to 7C are schematic views illustrating a first resist film formed by the process for producing a surface-emitting laser according to the second embodiment of the present invention, which is different from the first resist film (FIGS. 5A to 5C) in the first embodiment. FIG. 7A is a perspective view, FIG. 7B is a plan view, and FIG. 7C is a cross sectional view taken along the line 7C-7C illustrated in the perspective view. In FIGS. 7A, 7B and 7C, a first dielectric film 1016 and a first resist film 1018 are formed. A first pattern 1020 and a second pattern 1022 are provided. As illustrated in FIGS. 7A, 7B and 7C, the first resist film 1018 is formed on the first dielectric film 1016 so that the first pattern 1020 and the second pattern 1022, which have the same center axis but are different in diameter from each other, include opening portions. The first pattern 1020 is a pattern for forming the mesa structure and the second pattern 1022 is a pattern for forming the surface relief structure. In the structure illustrated in FIGS. 7A, 7B and 7C, the first pattern 1020 and the second pattern 1022 are two large and small concentric circular ring patterns having different diameters. However, the present invention is not limited to the structure. For example, the two large and small ring patterns may be two large and small concentric square ring patterns having different side lengths.

Third Embodiment

Figure 8A:
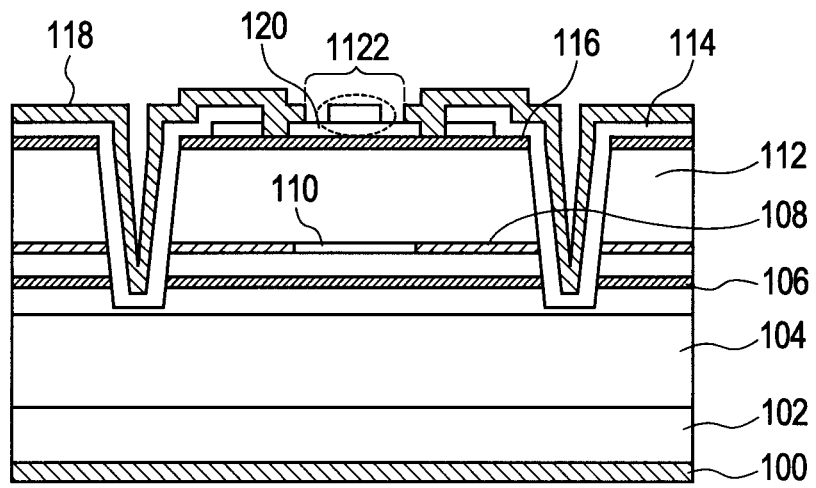
FIGS. 8A and 8B are schematic views illustrating a structure of a surface-emitting laser produced by a vertical cavity surface-emitting laser producing process according to a third embodiment of the present invention.
Figure 8B:
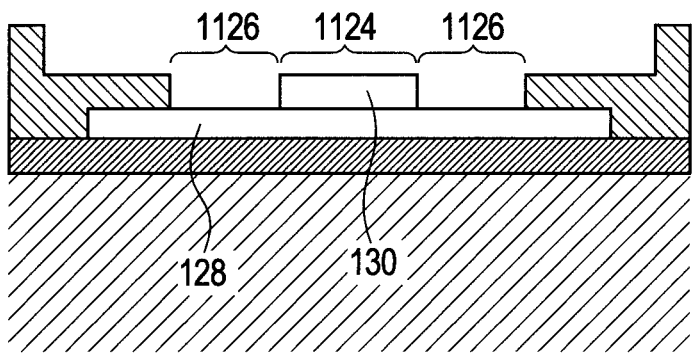

In a third embodiment, a process for producing a vertical cavity surface-emitting laser including a convex shape dielectric surface relief structure made of one kind of material is described with reference to FIGS. 8A and 8B. FIG. 8A is a schematic cross sectional view illustrating a surface-emitting laser including a light emission region 1122. FIG. 8B is an enlarged view illustrating the light emission region 1122 and the surroundings thereof. FIG. 8B illustrates a high-reflectance region 1124, a low-reflectance region 1126. In FIGS. 8A ands 8B, 1A and 1B illustrating the constituent elements in the first embodiment are expressed by the same reference numerals, and thus the duplicated descriptions thereof are omitted. In the first embodiment, the structure in which the two dielectric materials are combined is formed as the surface relief structure. On the other hand, in this embodiment, the structure using the single dielectric material is formed as the surface relief structure.

Next, the process for producing the surface-emitting laser in this embodiment is described. The producing process according to this embodiment is different from the producing process according to the first embodiment in that the second dielectric film is made of the same material as that of the first dielectric film. The thickness of the first dielectric film 128 is, for example, $(2x-1)\lambda/4n_1$ (x is integer equal to or larger than 1, $\lambda$ is oscillation wavelength, and $n_1$ is refractive index of first dielectric film). The thickness of the second dielectric film 130 is, for example, $(2y-1)\lambda/4n_2$ (y is integer equal to or larger than 1, $\lambda$ is oscillation wavelength, and $n_2$ is refractive index of second dielectric film). Because the first dielectric film and the second dielectric film are made of the same material, $n_1$ is equal to $n_2$. The thickness of each of the dielectric films may be set as appropriate. The dielectric films are desired to be made of a material, a refractive index of which is close to a refractive index of the semiconductor layer (contact layer). A preferred example of the material is silicon nitride (refractive index is 1.9) which is larger in refractive index than silicon oxide (refractive index is 1.5). The materials for the dielectric films are not limited to the two kinds described above. The structure illustrated in FIGS. 8A and 8B is the convex shape dielectric surface relief structure made of one kind of material. However, the present invention is not limited to such structure. For example, the concave shape dielectric surface relief structure in the second embodiment may be made of one kind of material.

Fourth Embodiment

Figure 9A:
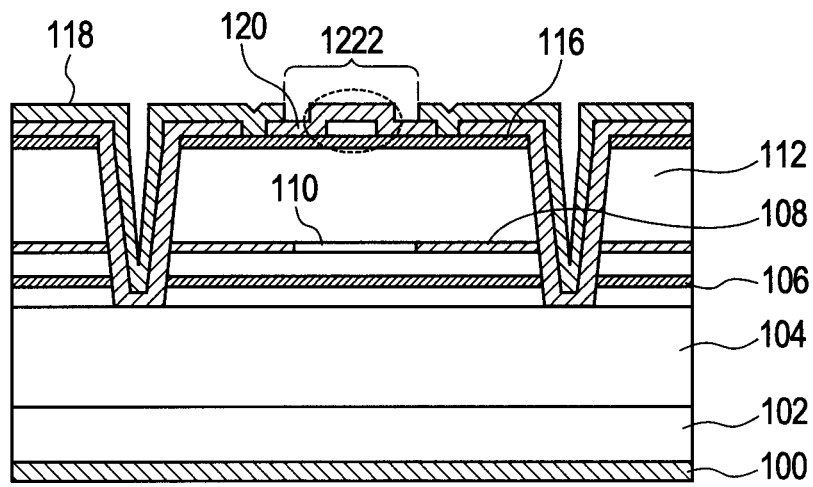
FIGS. 9A and 9B are schematic views illustrating a structure of a surface-emitting laser produced by a vertical cavity surface-emitting laser producing process according to a fourth embodiment of the present invention.
Figure 9B:
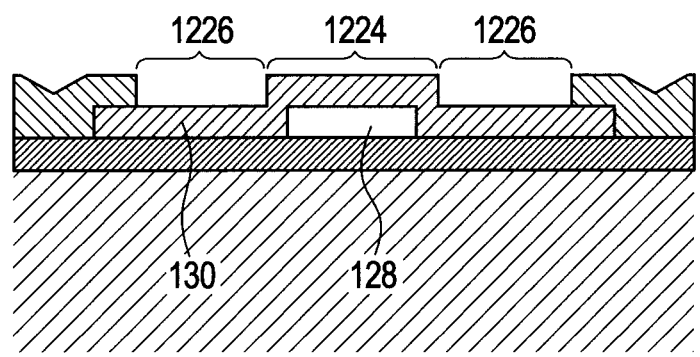

In a fourth embodiment, a process for producing a vertical cavity surface-emitting laser including a convex shape dielectric surface relief structure in which a first dielectric film is buried in a second dielectric film is described with reference to FIGS. 9A and 9B. FIG. 9A is a schematic cross sectional view illustrating a surface-emitting laser including a light emission region 1222. FIG. 9B is an enlarged view illustrating the light emission region 1222 and the surroundings thereof. FIG. 9B illustrates a high-reflectance region 1224, a low-reflectance region 1226. In FIGS. 9A ands 9B, the same constituent elements as in FIGS. 1A and 1B illustrating the constituent elements in the first embodiment are expressed by the same reference numerals, and thus the duplicated descriptions thereof are omitted. In the first embodiment, one of the two dielectric films having the different refractive indices is overlapped with the other thereof to form the convex high-reflectance region. On the other hand, in this embodiment, one of the two dielectric films having the different refractive indices is formed to cover the other thereof, to thereby form a convex shape high-reflectance region.

Figure 10A:
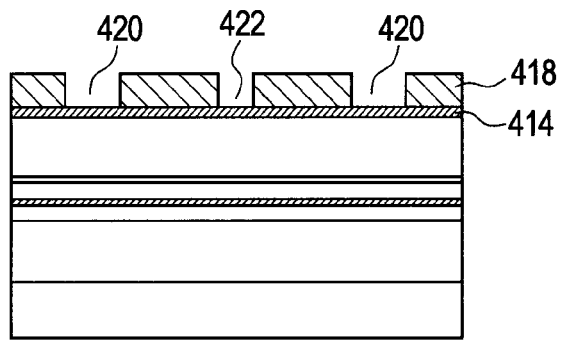
FIGS. 10A, 10B, 10C and 10D are views illustrating steps of the vertical cavity surface-emitting laser producing process according to the fourth embodiment of the present invention.
Figure 10B:
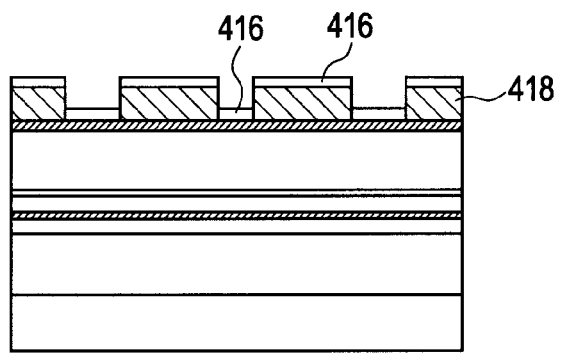
Figure 10C:
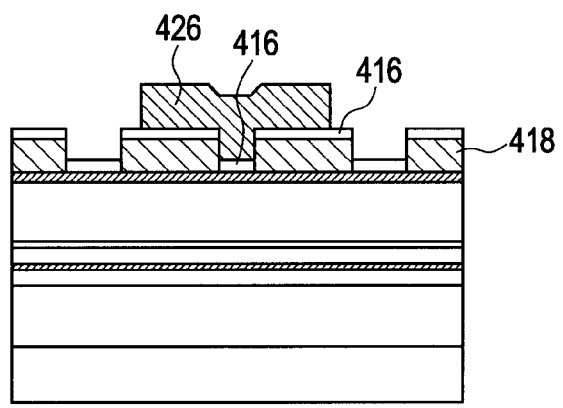

Next, the process for producing a surface-emitting laser according to this embodiment is described. As in the other embodiments, the multiple semiconductor layers including the lower DBR mirror layer, the active layer, the selective oxide layer, the upper DBR mirror layer, and the contact layer are laminated on the substrate in order. Subsequently, in a step illustrated in FIG. 10A (first resist film forming step), a resist film is formed on the laminated semiconductor layers and patterned to form a first resist film 418 having a first pattern 420 and a second pattern 422. Next, in a step illustrated in FIG. 10B (first dielectric film forming step), a first dielectric film 416 is formed. A thickness of the first dielectric film is, for example, $(2x-1)\lambda/4n_1$ (x is integer equal to or larger than 1, $\lambda$ is oscillation wavelength, and $n_1$ is refractive index of first dielectric film). The thickness of the first dielectric film may be set as appropriate. Next, in a step illustrated in FIG. 10C (second resist film forming step), a second resist film 426 is formed to cover at least the first dielectric film 416 which is formed in the second pattern 422.

Figure 10D:
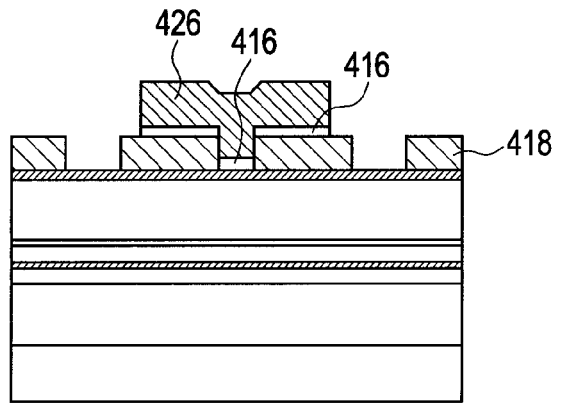
Figure 11A:
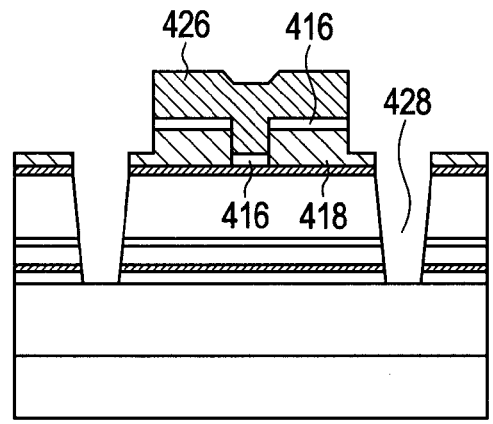
FIGS. 11A, 11B, 11C and 11D are views illustrating steps of the vertical cavity surface-emitting laser producing process according to the fourth embodiment of the present invention.
Figure 11B:
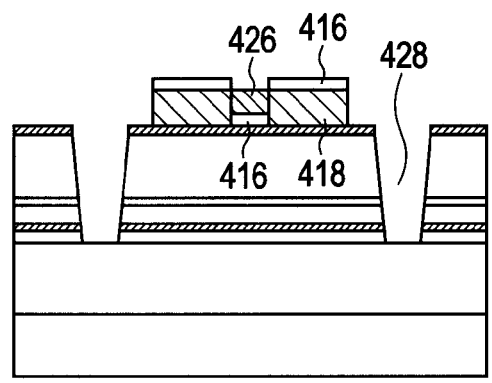
Figure 11C:
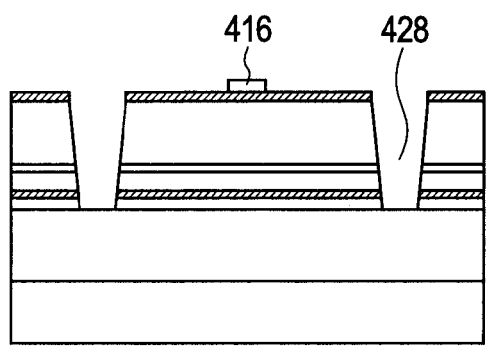

Next, in a step illustrated in FIG. 10D (dielectric film removing step), the second resist film 426 is used as a mask to remove the exposed first dielectric film 416 in the first pattern 420. Next, in a step illustrated in FIG. 11A (mesa structure forming step), the semiconductor layers in the first pattern 420, which exposed by the removal of the first dielectric film 416, is removed by dry etching to form the mesa structure. Next, in a step illustrated in FIG. 11B (second resist film removing step), the second resist film 426 is removed until the first dielectric film 416 formed on the first resist film 418 is exposed. Next, in a step illustrated in FIG. 11C (resist film removing step), the second resist film 426, the first dielectric film 416 formed on the first resist film 418, and the first resist film 418 are removed. As a result, the structure is provided in which the center axis of the mesa structure and the center axis of the first dielectric film are aligned with each other. Next, in a step illustrated in FIG. 11D (current confinement structure forming step), the current confinement layer is selectively oxidized to form the current confinement structure including the oxidized region 432 and the non-oxidized region 430.

Figure 12A:
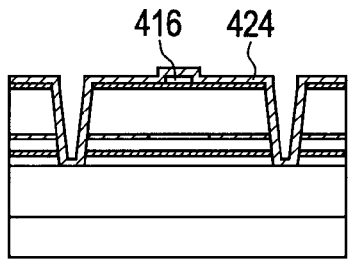
FIGS. 12A, 12B, 12C, 12D, 12E, 12F, 12G and 12H are views illustrating steps of the vertical cavity surface-emitting laser producing process according to the fourth embodiment of the present invention.
Figure 12B:
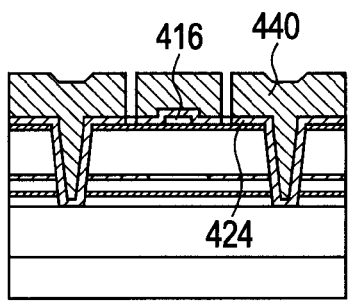
Figure 12C:
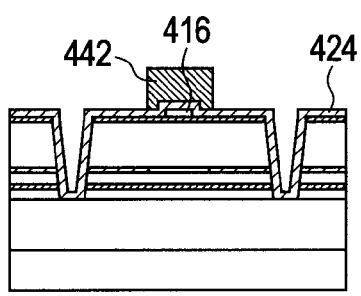
Figure 12D:
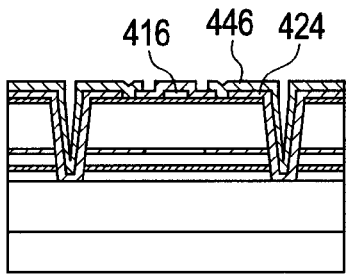

Next, in a step illustrated in FIG. 12A, a second dielectric film 424 is formed to cover the first dielectric film 416 and the surfaces of the laminated semiconductor layers. A thickness of the second dielectric film 424 is, for example, $(2y-1)\lambda/4n_2$ (y is integer equal to or larger than 1, $\lambda$ is oscillation wavelength, and $n_2$ is refractive index of second dielectric film). The thickness of the second dielectric film may be set as appropriate. In this case, a relationship of $n_2 \geq n_1$ is desired to be satisfied. For example, the first dielectric film 416 may be made of silicon oxide having a refractive index of 1.5 and the second dielectric film 424 may be made of silicon nitride having a refractive index of 1.9. The second dielectric film 424 is formed on the entire surface and thus may be served as an insulating film. Subsequent steps after the step illustrated in FIG. 12A are the same as the step illustrated in FIG. 3H and the subsequent steps, which are described in the first embodiment.

Figure 11D:
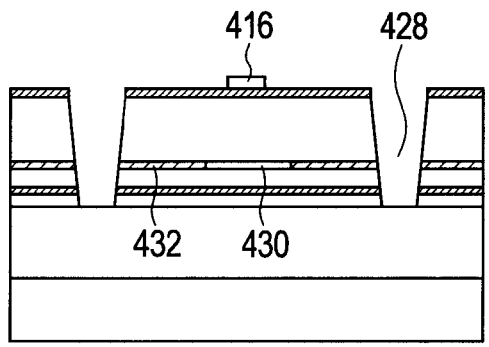
Figure 12E:
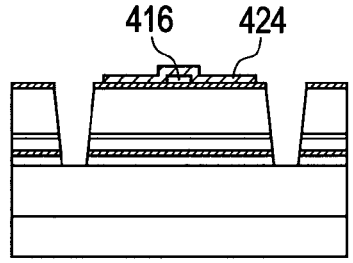

In this embodiment, the selective oxidization is performed while the contact layer is exposed in the step illustrated in FIG. 11D. However, as illustrated in FIG. 12E, the selective oxidization may be performed after the formation of the second dielectric film 424. For example, the second dielectric film may be removed in a manner covering the first dielectric film and exposing the side wall of the mesa structure, and then a portion of the semiconductor layer may be selectively oxidized to form the current confinement structure. The thickness of the second dielectric film 424 is, for example, $(2y-1)\lambda/4n_2$ (y is integer equal to or larger than 1, $\lambda$ is oscillation wavelength, and $n_2$ is refractive index of second dielectric film). The thickness of the second dielectric film may be set as appropriate. In this case, the surfaces of the laminated semiconductor layers other than the trench are covered with one of the first dielectric film 416 and the second dielectric film 424, and hence the surfaces of the laminated semiconductor layers may be protected against oxidization. Therefore, electrode may be formed with an excellent contact resistance in a subsequent step.

Figure 12F:
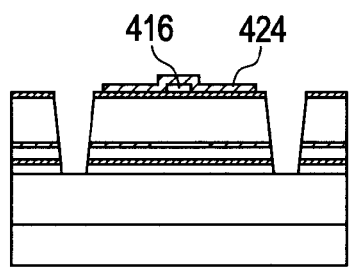
Figure 12G:
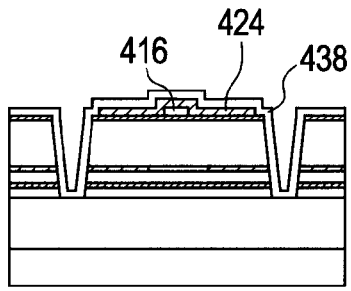
Figure 12H:
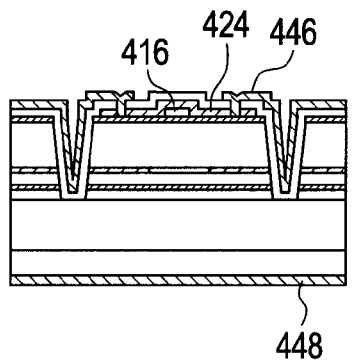

After the completion of a selective oxidization step illustrated in FIG. 12F, as illustrated in FIG. 12G, a third dielectric film 438 is formed to cover the entire surface. When a thickness of the third dielectric film is set to $(2z)\lambda/4n_3$ (z is integer equal to or larger than 1, $\lambda$ is oscillation wavelength, and $n_3$ is refractive index of third dielectric film) and a relationship of $n_3 \geq n_2 \geq n_1$ is satisfied, as illustrated in FIG. 12H, the device may be completed while the third dielectric film is formed in an emission opening region. In contrast to this, when the thickness of the third dielectric film does not satisfy $(2z)\lambda/4n_3$, the third dielectric film 438 located in the emission opening region is desired to be removed as in the step described in the first embodiment. The structure illustrated in FIGS. 12A to 12H is the convex shape dielectric surface relief structure in which the first dielectric film is covered with the second dielectric film. However, the present invention is not limited to such a structure. For example, the concave shape dielectric surface relief structure in the second embodiment may be the structure in which the first dielectric film is covered with the second dielectric film.

Fifth Embodiment

Figure 13A:
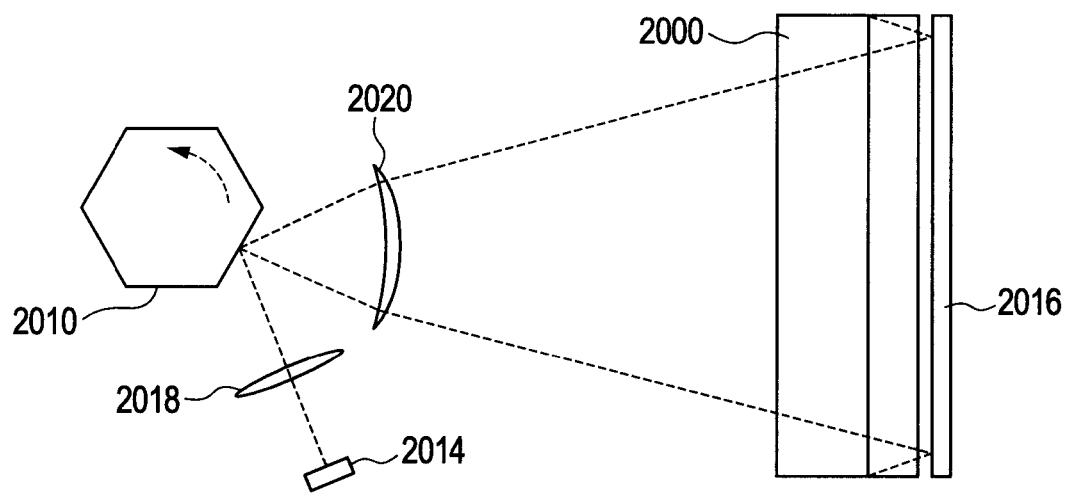
FIGS. 13A and 13B are schematic views illustrating an electrophotographic recording process type image forming apparatus mounting a laser array produced by a vertical cavity surface-emitting laser producing process according to a fifth embodiment of the present invention.
Figure 13B:
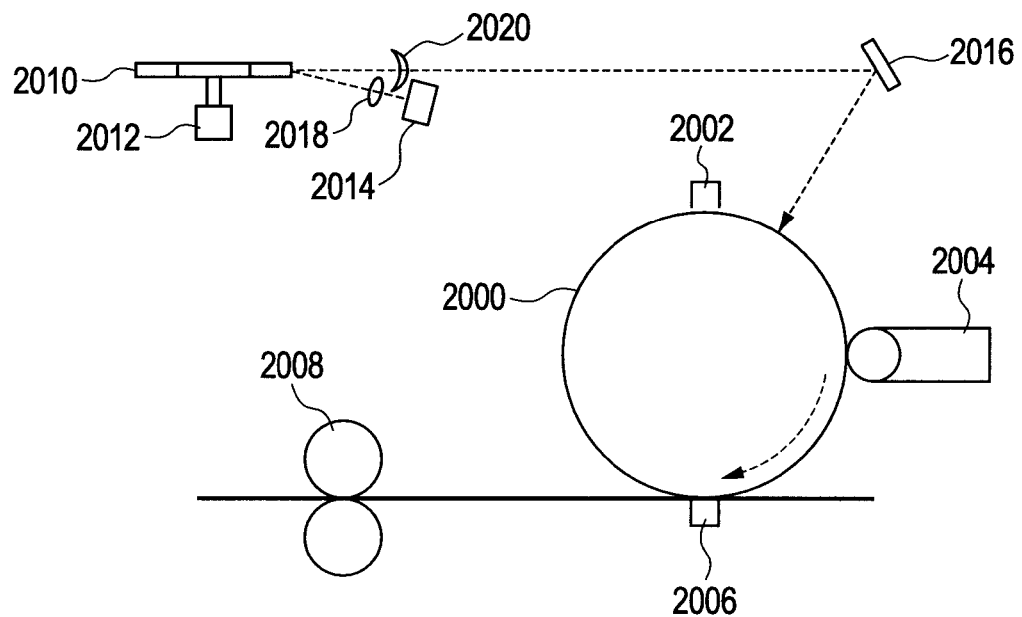

In a fifth embodiment, a structural example of an optical apparatus using the vertical cavity surface-emitting laser produced by the producing process according to any one of the embodiments described above is described with reference to FIGS. 13A and 13B. A structural example of an image forming apparatus including a laser array using the surface-emitting laser is described as the optical apparatus. FIG. 13A is a plan view illustrating the image forming apparatus and FIG. 13B is a side view illustrating the image forming apparatus. In FIGS. 13A and 13B, the image forming apparatus includes a photosensitive drum (photosensitive member) 2000, a charging unit 2002, a developing unit 2004, a transfer charging unit 2006, a fixing unit 2008, a rotating polygon mirror 2010, and a motor 2012. The image forming apparatus further includes a surface-emitting laser array 2014, a reflector 2016, a collimator lens 2018, and an f-θ lens 2020.

In this embodiment, the rotating polygon mirror 2010 is rotary-driven by the motor 2012 illustrated in FIG. 13B. The surface-emitting laser array 2014 serves as a light source for recording and is turned on or off by a laser driver (not shown) in response to an image signal. An optically modulated laser beam is emitted from the surface-emitting laser array 2014 to the rotating polygon mirror 2010 through the collimator lens 2018. The rotating polygon mirror 2010 is rotating in a direction indicated by the arrow of FIG. 13A. The laser beam output from the surface-emitting laser array 2014 is reflected on a reflecting surface of the rotating polygon mirror 2010 as a deflection beam of which an emission angle is continuously changed according to the rotation of the rotating polygon mirror 2010. The reflected laser beam is subjected to distortion correction by the f-θ lens 2020. Then, the photosensitive drum 2000 is irradiated with the laser beam via the reflector 2016 and scanned with the laser beam in the main scanning direction. In this case, a multiple-line image corresponding to the surface-emitting laser array 2014 is formed in the main scanning direction of the photosensitive drum 2000 by the laser beam reflected on one surface of the rotating polygon mirror 2010. The photosensitive drum 2000 is charged in advance by the charging unit 2002 and continuously exposed by the scanning of the laser beam to form an electrostatic latent image. The photosensitive drum 2000 is rotating in a direction indicated by the arrow of FIG. 13B. The formed electrostatic latent image is developed by the developing unit 2004. A visible image obtained by development is transferred onto a transfer sheet by the transfer charging unit 2006. The transfer sheet onto which the visible image is transferred is transported to the fixing unit 2008 and fixed thereby, and then delivered to the outside of the image forming apparatus.

In the above description, the structural example of the image forming apparatus is described as the optical apparatus. However, the present invention is not limited to the structural example. For example, a structure including the laser array according to the present invention which is used as a light source, an image display member, and an optical deflector may be a projection display structure in which a light beam from the light source is deflected by the optical deflector to be able to enter the image display member.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-000857, filed Jan. 6, 2010, which is hereby incorporated by reference herein in its entirety.

What is claimed is:

1. A process for producing a surface-emitting laser including a surface relief structure provided on a laminated semiconductor layer and a mesa structure, comprising:
    forming a first dielectric film on the laminated semiconductor;
    forming a first resist film having a first pattern for defining the mesa structure and a second pattern for defining the surface relief structure which are formed by lithography, on the first dielectric film;
    forming a second dielectric film on the first resist film and the first dielectric film formed under the second pattern using the first resist film as a mask, after forming the first resist film;
    forming a second resist film on the second dielectric film formed in the second pattern for covering the second pattern and exposing the first pattern;
    removing the first dielectric film formed under the first pattern using the first resist film and the second resist film as a mask;
    forming the mesa structure by removing the laminated semiconductor layer under the first pattern using the first resist film and the second resist film as a mask, after removing the first dielectric film; and
    forming a current confinement structure by oxidation from side surfaces of the mesa structure,
    wherein the first pattern and the second pattern are formed in the same step.

2. A process for producing a surface-emitting laser array, the process comprising arranging a plurality of surface-emitting lasers produced by the process according to claim 1.

3. The process for producing a surface-emitting laser according to claim 1, further comprising:
    removing the second resist film, the first resist film, and the second dielectric film formed on the first resist film, after forming the mesa structure.

4. The process for producing a surface-emitting laser according to claim 1, further comprising:
    removing a portion of the second resist film so as to cover the first dielectric film formed in the second pattern and expose the second dielectric film formed on the first resist film, after forming the mesa structure;
    removing the second dielectric film formed on the first resist film, after removing the portion of the second resist film; and
    removing the first resist film and the rest of the second resist film, after removing the second dielectric film formed on the first resist film.

5. The process for producing a surface-emitting laser according to claim 1, wherein a center axis of the second dielectric film formed in the second pattern is aligned with a center of the current confinement structure.

6. A process for producing a surface-emitting laser including a surface relief structure provided on a laminated semiconductor layer and a mesa structure, comprising:
    forming a first resist film having a first pattern for defining the mesa structure and a second pattern for defining the surface relief structure which are formed by lithography, on the laminated structure;
    forming a first dielectric film on the first resist film and the laminated structure formed under the second pattern using the first resist film as a mask, after forming the first resist film;
    forming a second resist film on the first dielectric film formed in the second pattern for covering the second pattern and exposing the first pattern;
    forming the mesa structure by removing the laminated semiconductor layer formed under the first pattern using the first resist film and the second resist film as a mask; and
    forming a current confinement structure by oxidation from side surfaces of the mesa structure,
    wherein the first pattern and the second pattern are formed in the same step.

7. The process for producing a surface-emitting laser according to claim 6, further comprising:
    removing a portion of the second resist film so as to cover the first dielectric film formed in the second pattern and expose the first dielectric film formed on the first resist film, after forming the mesa structure;
    removing the first dielectric film formed on the first resist film, after removing the portion of the second resist film;
    removing the first resist film and the rest of the second resist film, after removing the first dielectric film formed on the first resist film; and
    forming a second dielectric film on the first dielectric film formed in the second pattern and the laminated semiconductor layer.

8. A process for producing a surface-emitting laser array, the process comprising arranging a plurality of surface-emitting lasers produced by the process according to claim 6.

9. The process for producing a surface-emitting laser according to claim 6, further comprising:
    removing the second resist film, the first resist film, and the first dielectric film formed on the first resist film, after forming the mesa structure, and
    forming a second dielectric film on the first dielectric film formed in the second pattern and the laminated semiconductor layer, after removing the second resist film, the first resist film, and the first dielectric film formed on the first resist film.

10. The process for producing a surface-emitting laser according to claim 6, wherein a center axis of the first dielectric film formed in the second pattern is aligned with a center of the current confinement structure.

* * * * *